United States Patent
Gauthier, Jr. et al.

(10) Patent No.: US 7,085,113 B2
(45) Date of Patent: Aug. 1, 2006

(54) ESD PROTECTION POWER CLAMP FOR SUPPRESSING ESD EVENTS OCCURRING ON POWER SUPPLY TERMINALS

(75) Inventors: Robert J. Gauthier, Jr., Hinesburg, VT (US); Junjun Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/711,085

(22) Filed: Aug. 20, 2004

(65) Prior Publication Data

US 2006/0039093 A1    Feb. 23, 2006

(51) Int. Cl.
*H02H 9/00*    (2006.01)
*H02H 3/22*    (2006.01)
(52) U.S. Cl. .......................... 361/56; 361/111
(58) Field of Classification Search .................. 361/56, 361/111
See application file for complete search history.

(56) References Cited

U.S. PATENT DOCUMENTS

| 5,559,659 A | 9/1996 | Strauss |
| 6,369,994 B1 | 4/2002 | Voldman |
| 6,552,886 B1 * | 4/2003 | Wu et al. ..................... 361/56 |

* cited by examiner

*Primary Examiner*—Brian Sircus
*Assistant Examiner*—Dharti H. Patel
(74) *Attorney, Agent, or Firm*—Connolly Bove Lodge & Hutz LLP; Larry J. Hume; Michael J. LeStrange

(57) ABSTRACT

An ESD protection power clamp for suppressing ESD events. A clamping transistor having power source connections connected across the power supply terminals of an integrated circuit is connected to clamp the voltage during an ESD event. An RC timing circuit defines a time interval where ESD voltage for triggering the FET out of conduction. An inverter circuit connects the RC and timing circuit to the clamping FET. A dynamic feedback transistor is connected in series with one stage of the inverter and the power supply. During an ESD event, the feedback transistor delays the time for disabling the FET transistor, providing increased immunity against mistriggering of the clamping transistor, and forces the circuit to reset following the mistrigger event.

14 Claims, 3 Drawing Sheets

ESD PROTECTION POWER CLAMP FOR SUPPRESSING ESD EVENTS OCCURRING ON POWER SUPPLY TERMINALS

BACKGROUND OF INVENTION

The present invention relates to the design of integrated circuit electrostatic discharge protection (ESD) devices.

Integrated circuits have evolved into ever increasing higher circuit densities, with a corresponding reduction in size of circuit elements. The progress of integrated circuit technology has advanced to the point where active FET (Field Effect transistors) devices have gate lengths which are in the tenths of a micrometer. The integrated circuits have external connection pins which are vulnerable to ESD events due to handling by individuals who work with these package devices, and the thinner gates are susceptible to destruction from electrostatic discharge (ESD).

ESD protection has developed to the point where there are various models representing these events. Specifically, a human body model (HBM) has been developed which represents the discharge between two pins on an integrated circuit from the electrostatic potential on a human body. Typically, tests are conducted between all pins of the integrated circuit using the human body model.

A machine model (MM) has also been developed to represent the discharge from a machine tool which may have been charged with an electrostatic potential to an integrated circuit pin, and the peak current from this model can be as high as five amperes.

Efforts have been made to incorporate circuitry within the integrated circuit which will suppress the discharge resulting from an ESD event to a level which will not harm any of the devices which may be connected to an external pin of the circuit.

It is common in integrated circuit design to include ESD protection to the terminals which receive an operating voltage for the device. In this event, a sudden surge in voltage from an ESD event can be safely discharged so that no damage results to the internal active devices of the integrated circuit. The clamping circuits which hold the voltage across the power supply terminals to the nominal power supply voltage often require a large FET capable of discharging current which is produced from an ESD event which, however brief, may result in a peak current of two-three amperes or more and a peak voltage of many thousands of volts.

When an ESD potential occurs across the power supply terminals the large FET transistor conducts clamping the power supply terminal voltage. The large FET transistor is biased on when the inverter circuit connected to the gate of the large FET transistor switches to a level to render the device conducting to rapidly discharge the ESD event. Once the ESD event is discharged, an RC timing circuit, also connected to the power supply terminals, produces a timing signal. The inverter is connected between the timing circuit and the gate connection of the large FET transistor further delaying the timing signal produced from the RC timing circuit. The delayed timing signal biases the large FET clamping transistor off.

In developing these devices, the prior art used feedback to the inverter to increase the time delay, permitting the capacitor and resistor sizes for the RC timing circuit to be reduced. In this way, the circuit size can be reduced since a smaller capacitor and resistor may be used in the timing circuit.

These techniques, however, have not fully addressed the problems with power supply clamping circuits which suppress the ESD event. Specifically, the power clamp can be mistriggered by a voltage spike on the power supply, or, when the power supply is first powered up, the voltage may briefly rise to a level which will trigger the ESD protection. The power clamp can then only be reset by recycling the power supply.

Accordingly, there is the need to provide a power clamp circuit less susceptible to mistriggering and which will automatically reset if a mistrigger event does occur.

SUMMARY OF INVENTION

An ESD protection power clamp is provided which has a high immunity to mistriggering, and which resets itself in the event of a mistrigger. An FET transistor is connected across the power supply terminals and is enabled to conduct by an ESD event across the power supply terminals. An RC timing circuit is enabled and, after a prescribed time period, a voltage is generated to take the FET transistor out of conduction. An inverter circuit couples the RC timing circuit output signal to the FET gate transistor so that after the prescribed time delay, and the delay provided by the inverter circuit, the FET transistor is rendered non-conducting.

A feedback FET has a drain and source connected in series with one stage of the inverter circuit and the power supply terminals. The gate connection of the feed back FET is connected to the gate connection of the power clamp FET. The dynamic feedback provided through the feedback FET from the clamping FET transistor gate connection provides additional delay to the timing signal produced by the RC timing circuit. In the event of a mistrigger, the circuit will reset without the necessity of resetting the power supply.

DETAILED DESCRIPTION

Figure 1:
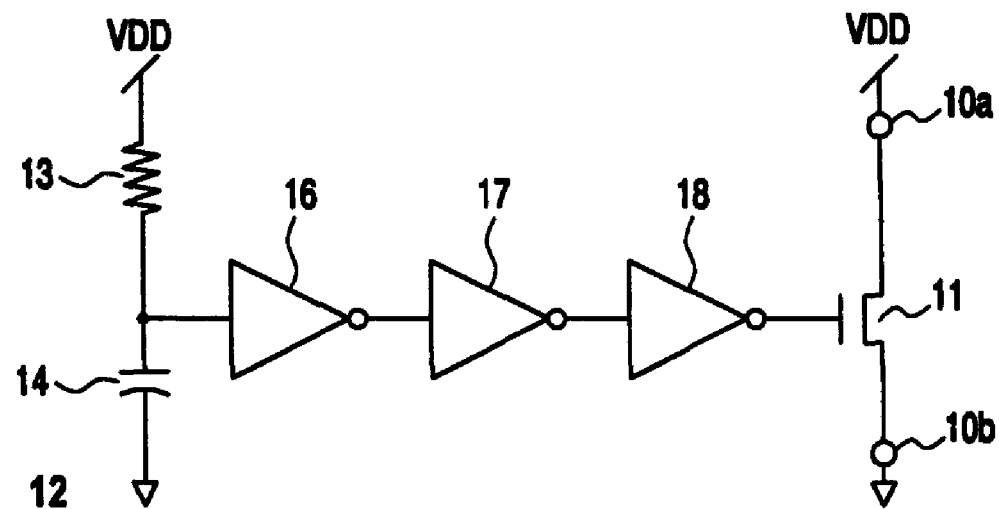
FIG. 1 shows the basic RC triggered MOSFET power clamp circuit.

FIG. 1 shows the basic ESD triggered power clamp for clamping the voltage across the power supply terminals of an integrated circuit. Transistor 11 is connected across terminals 10A and 10B of the integrated circuit which receive operating voltage VDD from a power supply. The large FET 11 has the current capacity to dissipate an HBM event or an MM event. During a high voltage event occurring across terminals 10A and 10B, inverter 18 will apply a voltage to the gate of the MOSFET 11, turning on the MOSFET 11, dissipating the over voltage appearing between terminals 10A and 10B. The FET 11 is reset to a non-conducting state by timing circuit 12 comprising a series resistance 13 and capacitor 14 also connected across terminals 10A and 10B. Resistance 13 maybe implemented as either a polysilicon device or as an FET connected as a resistor. Once the time set by the values of resistor 13 and capacitor 14 has expired following an ESD event, inverter 16, 17 and 18 apply a reset potential to the gate of FET 11 and FET 11 is rendered non-conducting.

The implementation of the prior art circuit of FIG. 1 has the disadvantage of requiring a large capacitor 14 and resistor 13 which disadvantageously uses up substrate area on the integrated circuit. Accordingly, feedback techniques have been developed which will permit the value of the capacitor 14 to be smaller.

Figure 2:
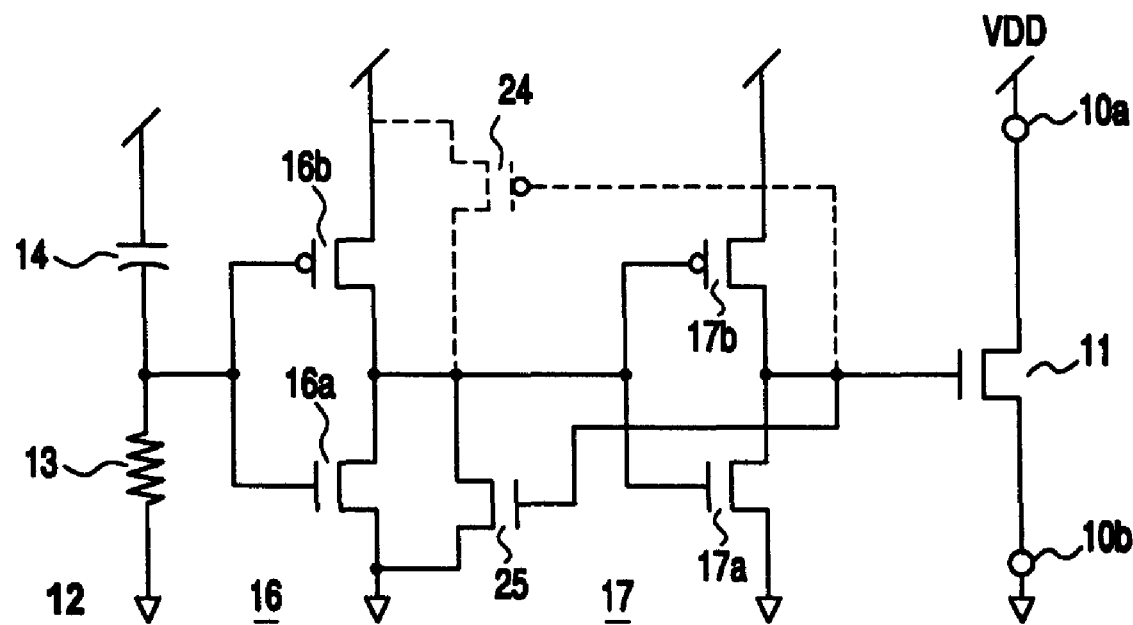
FIG. 2 shows an improved power clamp circuit having feedback according to the prior art.

One prior art technique for increasing the time for resetting the large FET 11 without increasing the size of capacitor 14 is shown in FIG. 2. FIG. 2 shows a large FET 11 connected across the power supply terminals 10a and 10b with a gate connection connected to the output of an inverter 17 comprising P-MOSFET 17b and N-MOSFET 17a. A second inverter 16 comprising N-MOSFET 16a and P-MOSFET 16b provides the input signal for the gate connections of P-MOSFET 17b and N-MOSFET 17a.

The circuit of FIG. 2 employs two feedback transistors 24 and 25. Transistors 24 and 25 reduce the current drawn during power-up of the circuit, as well as reducing the RC time constant of the timing circuit. The reduction in the RC time constant makes it less likely that the circuit will mistrigger during power-up. The circuit has the disadvantage in that if it does mistrigger, and the large FET 11 is rendered conductive, the transistor remains latched in the conducting mode until the power supply voltage is turned off and then on again.

Figure 3:
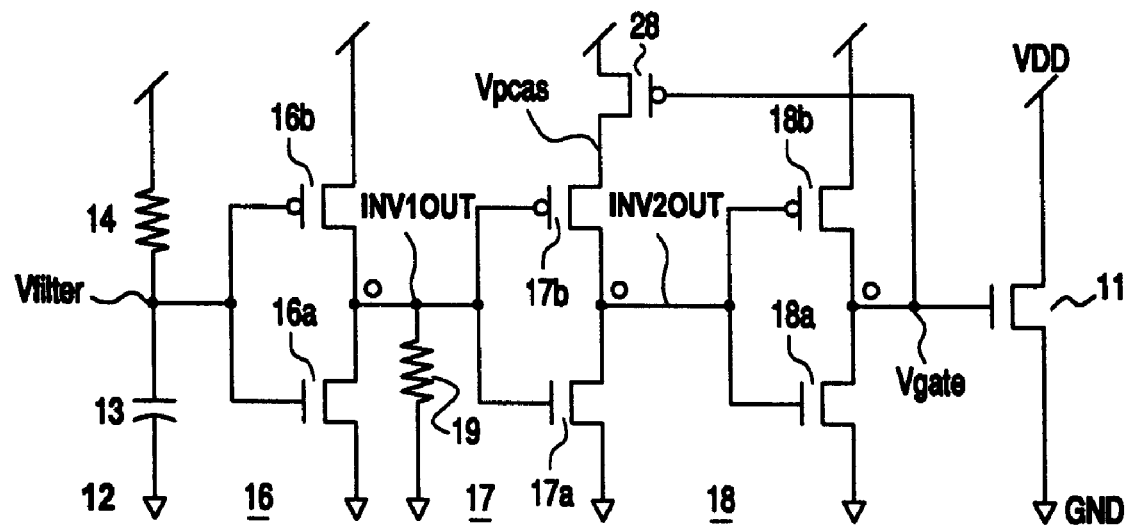
FIG. 3 shows the power supply clamping circuit in accordance the preferred embodiment of the present invention.

These disadvantages are remedied in accordance with a preferred embodiment of the invention by implementing a power supply clamp shown in FIG. 3. The preferred embodiment includes three inverter circuits 16, 17 and 18 connecting a timing circuit comprising capacitor 13 and resistor 14 with a large clamping FET 11. Each inverter circuit includes pull-down N-MOSFETS 16a, 17a and 18a, and pull-up P-MOSFETS 16b, 17b and 18b. As in the prior art, the over voltage experienced on terminals VDD and GND results in conduction of the large FET 11. Additionally, inverter 17 includes feedback provided through P-MOSFET 28 which is cascaded with the inverter stage 17 pull-up transistor P-MOSFET 17b. P-MOSFET 28 delays the output voltage of inverter 17 from rising, thereby delaying the time in which the large clamping FET 11 is disabled. This delay also helps provide immunity from being triggered by a normal power up sequence of the power supply. During a positive ESD event, the voltage at the input of inverter 16 holds the output of inverter 16 high until the capacitor 13 is charged by resistor 14. The voltage VINV1OUT forces the output of inverter 17 VINV2OUT to a low level. This in turn forces the output of inverter 18 high, fully turning on large FET 11. Also shown is an optional resistor 19 which helps to maintain VINV1OUT low, reducing current consumption by the circuit during power up of the power supply.

Once the timing circuit 13, 14 voltage rises to a level to switch inverter 16, the input to inverter 17 switches, and the P-FET 17b is conducting. However, the feedback P-MOSFET 28 is off, and the output VINV2OUT of inverter 17 remains in a low state. The output voltage rises slightly, due to a charge sharing between it and the node of feedback P-MOSFET 28 and the P-MOSFET 17b. Since the output of inverter 17 remains low, below the threshold voltage of inverter 18, the clamping FET 11 will remain conducting beyond the time constant of the RC timing circuit 13, 14.

The switching to the non-conducting state of clamping FET 11 occurs once enough leakage current is generated through the feedback P-MOSFET 28, due to the potential on the gate of clamping FET 11, to charge the output voltage on inverter 17 until the threshold voltage for inverter 18 has been reached. Inverter 18 will switch to apply a gate voltage on FET 11 below its threshold value, thus disabling current conduction through clamping FET 11.

Figure 4A:
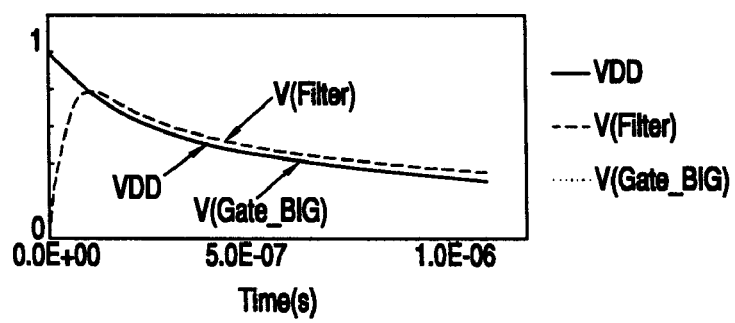
FIG. 4A shows a simulated gate voltage response for a circuit of FIG. 3 to a simulated ESD event.
Figure 4B:
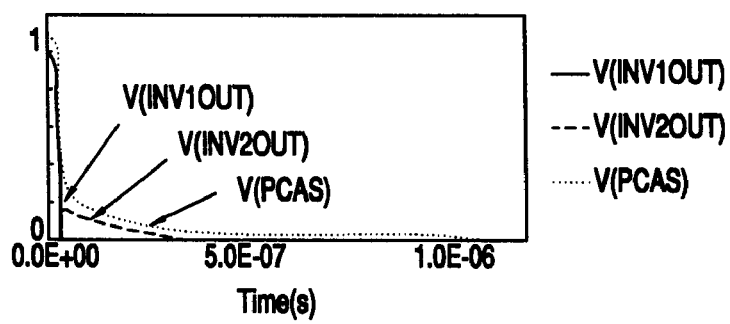
FIG. 4B shows the simulated inverter response to an ESD event.

Referring now to FIGS. 4A and 4B, a simulated response of the circuit of FIG. 3 is shown for a 3 KV HBM event. The simulation utilizes a 90 nm CMOS technology HSPICE model. As shown in FIG. 4A, the power supply terminal voltage VDD never exceeds approximately 1.06 volts, under this ESD condition. Once the RC timing circuit 13, 14 output voltage reaches the switching level of inverter 16, inverter 16 changes state and charge sharing begins between the output of inverter 17 and the junction (PCAS) of P-MOSFET 28 and P-MOSFET 17b. FIG. 4B shows that there is only a slight rise in the output voltage of inverter 17 of approximately 200 milivolts which is below the threshold voltage for inverter 18 to change state.

Figure 5A:
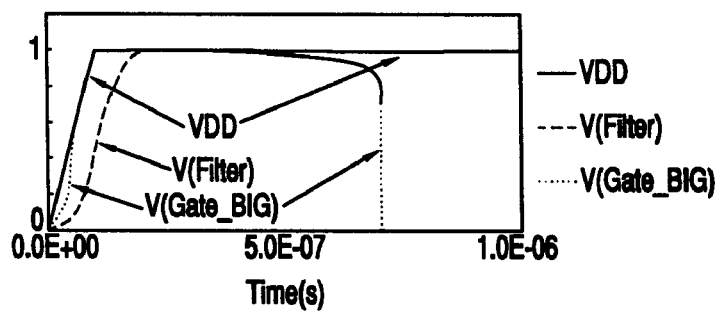
FIG. 5A shows the simulated operation of the power clamp circuit of FIG. 3 if mistriggered.
Figure 5B:
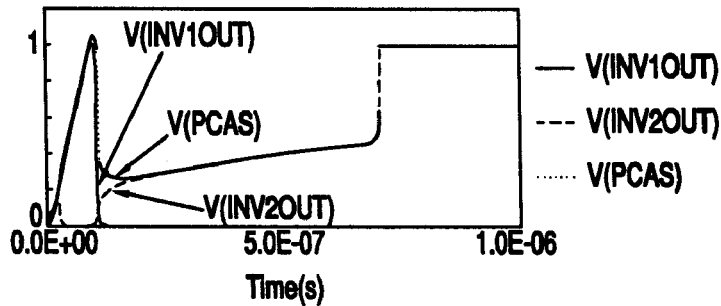
FIG. 5B shows the simulated operation of the circuit during a reset.

FIG. 5A shows the simulated circuit response under conditions where a very fast voltage power-up by the power supply, or a power supply over voltage, can initiate clamping of the power supply voltage terminals to VDD. Use of the cascaded P-MOSFET feedback transistor 28 of FIG. 3 will result in an automatic reset of the circuit in these circumstances as shown in FIG. 5B. Thus, the circuit avoids latching clamping FET 11 on, and recycling the power supply is therefore unnecessary. In the event that an over voltage condition results from a fast power-up, or during normal operation, the clamping FET 11 is held on until VDD drops below the inverter switching threshold. FIGS. 5A and 5B demonstrate how the output voltage from inverter 17 is eventually charged up towards VDD by the sub-threshold leakage current of the P-MOSFET 28. At that time, the output voltage of inverter 17 switches and inverter 18 subsequently switches to apply a gate voltage on clamping transistor 11 to switch clamping FET transistor 11 off.

If the circuit mistriggers it will turn itself off. For instance, in the face of a very fast 0.1 micro-second power-up event, the simulated result shown in FIGS. 5A and 5B shows that after approximately 800 ns the output of inverter 17 has charged to a voltage where the output of inverter 18 (VGateBig) switches and clamping FET 11 is turned off.

As was noted, the circuit does also provides some immunity to mistriggering over the prior art circuit of FIG. 2. The presence of P-MOSFET 28 limits the amount of current that the large FET 11 can draw in the early stages of power up of the power supply. During the initial stages of a normal power up, PMOSFET 28 maintains the output of inverter 17 low and it can not trigger the FET 11 into conduction unless the charge build up at PCAS is sufficient to switch inverter 17. Hence, it is more difficult to trigger the large FET 11 unless a large voltage is available to cause a sufficient charge build up at PCAS.

Figure 6:
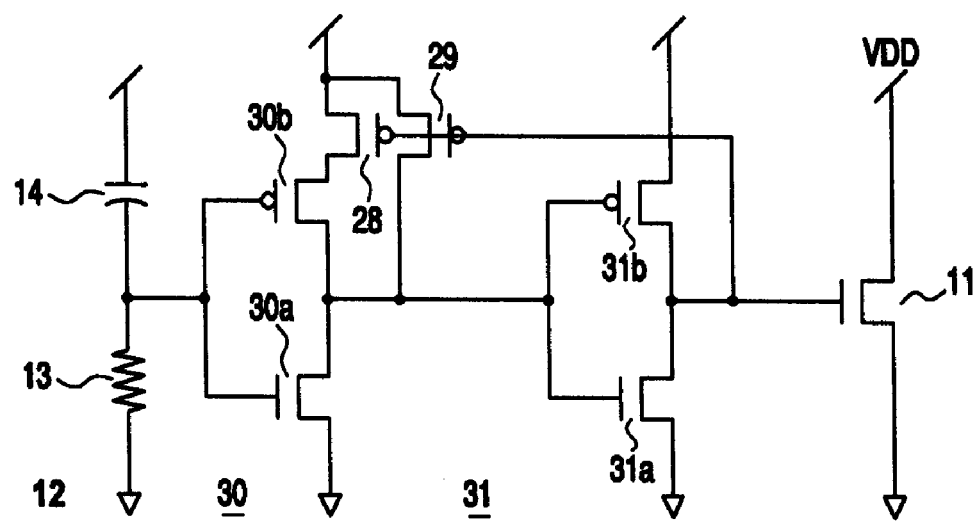
FIG. 6 is a clamp circuit with dynamic and static feedback.

The foregoing embodiment may also be used with direct feedback, to reduce the current consumption when the cascaded P-MOSFET 28 is turned on weakly during part of a power-up transient. The advantages of direct feedback and the cascaded dynamic feedback in accordance with the present invention can be realized with the circuit of FIG. 6. Timing circuit 13 and 14 is connected through two inverters 30 and 31 to the gate of clamping FET 11. Inverters 30, 31 have pull-down FETS 30a, 31a and pull-up transistors 30b and 31b. A P-MOSFET 28 is shown cascaded with the pull-up transistor of inverter 30, as in the preferred embodiment. Additionally, a second P-MOSFET 29 is shown which will provide for direct feedback, limiting the amount of current drawn by the FET 11 during power-up of the circuit power supply.

The preferred embodiment of the invention has been described with respect to a NFET clamping transistor 11 and a P-MOSFET feedback transistor 28. It should be recognized by those skilled in the art that in the event a PFET is used for the clamping transistor 11, an N-MOSFET is used for the feedback transistor 28 and is connected in series with pull-down transistor 17a to achieve the same result.

The foregoing description of the invention illustrates and describes the present invention. Additionally, the disclosure shows and describes only the preferred embodiments of the invention in the context of an ESD protection power clamp for suppressing ESD events occurring on power supply terminals, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

The invention claimed is:

1. An ESD protection power clamp for suppressing ESD events comprising:
   an FET having drain and source connections connected across power supply terminals of an integrated circuit for clamping the voltage at said terminals to a power supply voltage during an ESD event;
   an RC timing circuit connected between the power supply terminals which provide a voltage proportional to an ESD voltage for triggering said FET out of conduction following an ESD event;
   an inverter circuit having a plurality stages connected between said power supply terminals, said inverter circuit having an input connection connected to receive said RC timing circuit voltage, and having an output connected to said FET gate connection; and
   a feedback FET having a drain and source connected in series with one stage of said inverter circuit and said power supply terminals, and having a gate connection connected to said FET gate connection, whereby during an ESD event, said feedback FET provides dynamic feedback preventing said gate connection from latching said FET for clamping the voltage on said terminals into a conducting mode when power supply potential is applied across said terminals.

2. The ESD protection power clamp according to claim 1, wherein said inverter circuit comprises first, second and third pairs of serially connected FET transistors connected across said power supply terminals, said pairs of transistors having common gate connections, said first pair of transistors having gate connections connected to said RC timing circuit, said second pair of transistors having gate connections connected to the serial connection of said first pair of transistors, and said third pair of transistors having gate connections connected to the serial connection of said second pair of transistors, said feedback FET being connected in series with said second pairs of serially connected FET transistors, said third pair of transistors serial connection connected to said FET gate connection.

3. The ESD protection power clamp according to claim 1, further comprising a second feedback transistor for supplying a feedback signal to said inverter circuit from said FET gate connection for reducing the power up current drawn by said FET during power up.

4. The ESD protection power clamp according to claim 3, wherein said inverter circuit comprises first and second pairs of serially connected transistors, said first pair of transistors having gate connections connected to receive said RC timing circuit voltage, said second pair of serially connected transistors connected in series with said feedback FET and having gate connections connected to said first pair of transistors serial connection and to said second feedback transistor, said second pair of transistors serial connection being connected to said FET gate connection.

5. The ESD protection power clamp according to claim 1, wherein a resistor in said RC timing circuit is a FET based resistor.

6. The ESD protection power clamp according to claim 1, wherein said feedback transistor is connected in series with a pull up transistor of said inverter circuit stage.

7. An ESD protection power clamp for suppressing ESD events comprising:
   an FET having drain and source connections connected across power supply terminals of an integrated circuit for clamping the voltage at said terminals during and ESD event;
   an RC timing circuit connected between the power supply terminals which provide a voltage proportional to an ESD voltage for triggering said FET out of conduction following an ESD event;
   an inverter circuit comprising first, second and third stages of pull-up and pull-down transistors connected in tandem, a first stage of said inverter connected to said RC timing circuit, and a third stage of said inverter circuit providing an output for said inverter connected to said FET gate connection; and
   a feedback transistor connected in series with said second stage pull up transistor, and having a gate connection connected to said FET gate connection, wherein during a power event where normal power supply voltage is applied to said power supply terminals, said feedback transistor prevents said FET from latching into a clamping mode.

8. The ESD protection device according to claim 7, wherein said FET transistor for clamping said voltage is a P-MOSFET and said first feedback transistor is an N-MOSFET.

9. The ESD protection power clamp according to claim 7, wherein said FET transistor is an N-MOSFET transistor and said feedback transistor is a P-MOSFET transistor.

10. An ESD protection power clamp for suppressing ESD events comprising:
    an FET having drain and source connections connected across power supply terminals of an integrated circuit, and a gate connection;
    an RC timing circuit connected between the power supply terminals which provide a voltage proportional to an ESD voltage for triggering said FET into connection;
    an inverter circuit comprising first and second stages of pull-up and pull-down transistors connected in tandem, a first stage of said inverter connected to said RC timing circuit, and a second stage of said inverter circuit providing an output for said inverter connected to said FET gate connection; and a first feedback transistor having a gate connected to said gate connection of said FET and having a source and drain connected in series with a pull-up transistor of said first stage for preventing said FET from latching into a clamping mode; and a second feedback transistor having source and drain connections connected across said serial connection of said first transistor and said pull-up transistor, said second feedback transistor reducing power consumption during a power up of said power supply voltage.

11. The ESD protection circuit according to claim 10, wherein said FET transistor for clamping said voltage is an N-MOSFET transistor, and said first and second feedback transistors are P-MOSFET transistors.

12. The ESD protection device according to claim 10, wherein said RC timing circuit comprises a capacitor and a resistor which is formed from an FET based transistor.

13. The ESD protection device according to claim 10, wherein said RC timing circuit comprises a capacitor and a resistor which is formed as a polysilicon device.

14. The ESD protection circuit according to claim 7, wherein said FET transistor for clamping said voltage is an N-MOSFET transistor, and said feedback transistor is a P-MOSFET transistor.

* * * * *